(12) United States Patent  (10) Patent No.: US 7,667,236 B2
Eliashevich et al.  (45) Date of Patent: Feb. 23, 2010

(54) OPTIMIZED CONTACT DESIGN FOR THERMOSONIC BONDING OF FLIP-CHIP DEVICES

(75) Inventors: Ivan Eliashevich, Maplewood, NJ (US); Hari Venugopalan, Somerset, NJ (US); Xiang Gao, Edison, NJ (US); Michael J. Sackrison, Bethlehem, PA (US)

(73) Assignee: Lumination LLC, Cleveland, OH (US)

( * ) Notice: Subject to any disclaimer, the term of this patent is extended or adjusted under 35 U.S.C. 154(b) by 301 days.

(21) Appl. No.: 10/588,473

(22) PCT Filed: Dec. 22, 2004

(86) PCT No.: PCT/US2004/043751
§ 371 (c)(1), (2), (4) Date: Aug. 1, 2006

(87) PCT Pub. No.: WO2005/065325
PCT Pub. Date: Jul. 21, 2005

(65) Prior Publication Data
US 2007/0145379 A1 Jun. 28, 2007

(51) Int. Cl.
*H01L 27/15* (2006.01)
(52) U.S. Cl. .............................. 257/79; 257/99; 257/94; 257/95; 257/E33.074
(58) Field of Classification Search .................. 257/79, 257/94–95, 99, E33.074
See application file for complete search history.

(56) References Cited
U.S. PATENT DOCUMENTS
6,809,340 B2* 10/2004 Kato et al. .................... 257/79
6,958,498 B2* 10/2005 Shelton et al. ................. 257/99
7,141,828 B2* 11/2006 Venugopalan ................. 257/99

* cited by examiner

Primary Examiner—Kenneth A Parker
Assistant Examiner—Jose R Diaz
(74) Attorney, Agent, or Firm—Fay Sharpe LLP

(57) ABSTRACT

A light emitting device (A) includes a semiconductor die (100). The semiconductor die includes: an epitaxial structure (120) arranged on a substrate (160), the epitaxial structure forming an active light generating region (140) between a first layer (120n) on a first side of the active region and having a first conductivity type, and a second layer (120p) on a second side of the active region and having a second conductivity type, the second side of the active region being opposite the first side of the active region and the second conductivity type being different that the first conductivity type; a first contact (180n) in operative electrical communication with the active region via the first layer in the epitaxial structure, the first contact being arranged on a side of the epitaxial structure opposite the substrate; a second contact (180p) in operative electrical communication with the active region via the second layer in the epitaxial structure, the second contact being arranged on a side of the epitaxial structure opposite the substrate; a first contact trace corresponding to the first contact and defined at a surface thereof distal from the substrate, the first trace including at least one area designated for bonding (320n); and, a second contact trace corresponding the second contact and defined at a surface thereof distal from the substrate, the second trace including at least one area (320p) designated for bonding. Suitably, the first contact trace is substantially enclosed within the second contact trace.

13 Claims, 8 Drawing Sheets

US 7,667,236 B2

OPTIMIZED CONTACT DESIGN FOR THERMOSONIC BONDING OF FLIP-CHIP DEVICES

BACKGROUND

The present inventive subject matter relates to the electronic arts. It finds particular application in conjunction with group III-V flip-chip bonded light emitting diodes (LEDs) for lighting applications, and will be described with particular reference thereto. However, one of ordinary skill in the art will appreciate that it is also amenable to other like applications, e.g., in conjunction with, other types of flip-chip LEDs, other flip-chip bonded epitaxial semiconductor devices (such as vertical cavity surface emitting laser diodes), other non-flip-chip bonding arrangements, etc.

Traditionally, LEDs have been packaged with a die or chip having its substrate down on a heat sink; here, light is extracted from the LED through current spreading, semi-transparent layers deposited on, for example, the die or chip's p-type layer. However, the overall light extraction efficiency of the device can be hindered due to light absorption in the current spreading layer. An alternative method to the aforementioned packaging is to use a flip-chip geometry in which light extraction is primarily through the substrate. For example, it has been shown that a 60% increase in light extraction efficiency can be obtained by flip-chip mounting.

The manufacture of a high lumen output LED can benefit from flip-chip packaging or mounting. In the flip-chip mounting configuration, an LED die (typically, with a light-transmissive substrate arranged on a back side and p and n-electrodes arranged on a front side opposite the back side) is bonded "face down" to a mount or sub-mount, i.e., with the epitaxial layers proximate to the mount and the substrate distal from the mount. The flip-chip arrangement has a number of advantages, e.g., including improved thermal heat sinking due to the proximity of the active layers to the heat sink, and reduction of electrode shadowing losses.

In flip-chip mounting configurations, solder bumps (e.g., greater than approximately 50 μm) are typically used to attach the die or chip to its mount or sub-mount (see, e.g., FIG. 1). FIG. 1 shows an LED including a die or chip 10 attached or being attached to a support 20 via solder bumps 30. The die 10 has an epitaxial structure 12, typically including multiple layers of semiconductor material and forming an active light-generating region 14 (e.g., a double heterostructure, multiple quantum well (MQW), or other suitable light-generating configuration), that is usually disposed on a substrate 16 that is substantially transparent or transmissive to light at the wavelength generated. A pair of electrodes and/or electrical contacts (e.g., a p-type contact 18p and an n-type contact 18n) are also arranged on the LED in operative electrical communication with the light-generating region 14 so that electrical power supplied to the LED therethrough drives the same to generate light. In a so called lateral current flip-chip LED device, the electrodes are commonly located on the same side of the epitaxial structure 12 generally opposite the substrate 16, as opposed to a so called vertical current LED device where the pair of electrodes are usually arranged on two sides of the LED, each on a side opposite from the other.

In operation, an electric current passed through the LED, using the electrical contacts, is carried principally by electrons in an n-type layer 12n and by electron vacancies or "holes" in a p-type layer 12p. The electrons and holes move in opposite directions toward the active region 14 or a junction, where they recombine with one another. Energy released by the electron-hole recombination is emitted from the LED as light. As used herein, the term "light" includes visible light as well as electromagnetic radiation in the infrared and ultraviolet wavelength ranges. The wavelength of the emitted light depends upon many factors, including the composition of the semiconductor materials, the structure of the junction, the presence or absence of impurities or doping, and the like.

Commonly, the LED is mounted to the support 20 (e.g., a sub-mount, printed circuit board (PCB), reflector cup, etc.) in flipped orientation, that is, with the light-generating region 14 proximate to the support 20 and the substrate 16 distal from the support 20. In the flip chip arrangement, the goal is generally to extract a substantial amount of light from the LED through the light-transmissive substrate 16.

FIG. 2 shows a typical contact layout or contact trace for flip-chip bonding. Bump areas, are designated for each electrode or contact type. For example, n-type bump areas 32n are designated on the n-type contact 18n, and p-type bump areas 32p are designated on the p-type contact 18p. The respective bump areas correspond to the locations, within the respective p and n-type contact layouts or traces, where the solder bumps 30 contact and/or bond with the respective p and n-type electrodes or contacts 18p and 18n.

For flip-chip packaging of LEDs, solder attachment has its own merits and drawbacks. One advantage is that the relatively large thickness of the solder tends to planarize; thus, limiting restrictions that are placed on the difference in thickness between, or the relative elevation/height of, the p and n-type contacts 18p and 18n. Note, e.g., the different elevations of the p and n-type contacts 18p and 18n in FIG. 1. Solder attachment of the chip 10 to the support 20, however, can suffer from high thermal resistance; in addition, since it is often the first step of a packaging process, a high re-flow temperature can be demanded (e.g., greater than approximately 250° C.) and this may compromise the reflectivity of the p-type contact 18p, which is otherwise desirable. Also, solder processes typically require cleaning of flux residue after bonding. The cleaning solution or residual flux may compromise the LED's reliability by creating a leakage path through resistive shunt.

In a flip-chip LED configuration, desirable characteristics for die attachment include low thermal resistivity and structural robustness. Both of these can be fulfilled by using thermosonic (TS) bonding for packaging or mounting. However, the TS bonding process can present its own challenges, e.g., maintaining good contact across the chip area.

With reference to FIG. 3, TS bonding typically employs Au bumps 34 arranged on the support 20 that enable the chip or die 10 (via the p and n-type contacts 18p and 18n which are also typically terminated with Au) to be attached or bonded to the support 20 with the application of ultrasonic energy, and without any intermediate melting/re-solidification step. Consequently, lower packaging temperatures (e.g., around approximately 150° C.) can be used, thus avoiding loss of reflectivity of the p-type contact 18p. In addition, the use of Au bumps 34 instead of solder, lowers the thermal resistance of the package.

Commonly, deformation of the Au bumps 34, and physical bonding of the Au bumps 34 to the respective p and n-type bump areas 32p and 32n designated on the chip 10, occurs in TS bonding. Accordingly, it is advantageous to have the p and n-type bump areas 32p and 32n on the chip 10 at more or less the same elevation, i.e., within the extent of deformation of the Au bumps 34. The tendency is therefore to manufacture an LED die for use in a TS bonding application with a thickened or elevated n-type contact 18n. Note, e.g., the substantially similar elevations of the p and n-type contacts 18p and 18n in FIG. 3, and compare the thickness or elevation of the n-type contact 18n in FIG. 3 with that of FIG. 1.

In a typical chip 10, a significant amount of the light may be emitted from a outer periphery of the active region 14. However, as can be appreciated, with a contact layout or trace such as that illustrated in FIG. 2 and contact elevations such as those illustrated in FIG. 3, the n-type contact 18n completely encircles the outer periphery of the active region 14. Consequently, light emitted therefrom may be blocked from exiting the die 10, e.g., getting absorbed, or otherwise trapped in the die 10, by the n-type contact layout or trace on the chip 10. This can result in a significant loss of light extraction efficiency.

At first glance, it might appear from FIGS. 1 through 3, that the easiest way to minimize the aforementioned light extraction issue is to eliminate that portion of the n-type contact layout or trace not containing any n-type bump areas 32n, e.g., having a contact layout or trace as shown in FIG. 4, where the n-type contact 18n is restricted to one edge of the die 10, or so that the n-type trace does not encircle the entire outer periphery. However, this can lead to poor current spreading and non-uniform light emission. For example, most of the light would tend to be emitted from that portion of the active region 14 where the p-type layer 12p is proximate to the n-type trace or contact 18n, which would in turn still hinder its extraction.

In some designs, the n-type trace can include several electrically separated regions or pieces, interconnected only on the mount or sub-mount level. However, if the chip or mount or sub-mount planarity is imperfect, one of such pieces may not be firmly connected to the bumps, resulting in higher electrical resistance of that piece and current spreading non-uniformity.

Accordingly, a new and improved LED and/or semiconductor die and/or method for packaging and/or mounting the same is disclosed that overcomes the above-referenced problems and others.

BRIEF DESCRIPTION

In accordance with one exemplary embodiment, a light emitting device including a semiconductor die is provided. The semiconductor die includes: an epitaxial structure arranged on a substrate, the epitaxial structure forming an active light generating region between a first layer on a first side of the active region and having a first conductivity type, and a second layer on a second side of the active region and having a second conductivity type, the second side of the active region being opposite the first side of the active region and the second conductivity type being different that the first conductivity type; a first contact in operative electrical communication with the active region via the first layer in the epitaxial structure, the first contact being arranged on a side of the epitaxial structure opposite the substrate; a second contact in operative electrical communication with the active region via the second layer in the epitaxial structure, the second contact being arranged on a side of the epitaxial structure opposite the substrate; a first contact trace corresponding to the first contact and defined at a surface thereof distal from the substrate, the first trace including at least one area designated for bonding; and, a second contact trace corresponding the second contact and defined at a surface thereof distal from the substrate, the second trace including at least one area designated for bonding. Suitably, the first contact trace is substantially enclosed within the second contact trace.

In accordance with another exemplary embodiment, a method of manufacturing a light emitting device is provided. The method includes: providing a semiconductor die, the semiconductor die including an epitaxial structure arranged on a substrate, the epitaxial structure having an active light generating region between a first layer on a first side of the active region and having a first conductivity type, and a second layer on a second side of the active region and having a second conductivity type, the second side of the active region being opposite the first side of the active region and the second conductivity type being different that the first conductivity type; forming a first contact on the semiconductor die in operative electrical communication with the active region via the first layer of the epitaxial structure, the first contact being arranged on a side of the epitaxial structure opposite the substrate and having a corresponding first contact trace defined at a surface thereof distal from the substrate, the first trace including at least one area designated for bonding; and, forming a second contact on the semiconductor die in operative electrical communication with the active region via the second layer of the epitaxial structure, the second contact being arranged on a side of the epitaxial structure opposite the substrate and having a corresponding second contact trace defined at a surface thereof distal from the substrate, the second trace including at least one area designated for bonding. Suitably, the first contact trace is substantially enclosed within the second contact trace.

Numerous advantages and benefits of the inventive subject matter disclosed herein will become apparent to those of ordinary skill in the art upon reading and understanding the present specification.

BRIEF DESCRIPTION OF THE DRAWINGS

The present inventive subject matter may take form in various components and arrangements of components, and in various process operations or method steps and arrangements of process operations or method steps. The drawings are only for purposes of illustrating preferred embodiments and are not to be construed as limiting. In various views, it may be advantageous to show exaggerated layer thicknesses and/or illustrate other dimensions out of portion to one another for visual clarity of selected elements or other reasons. The figures are therefore not drawn to scale.

DETAILED DESCRIPTION OF PREFERRED EMBODIMENT(S)

Figure 5:
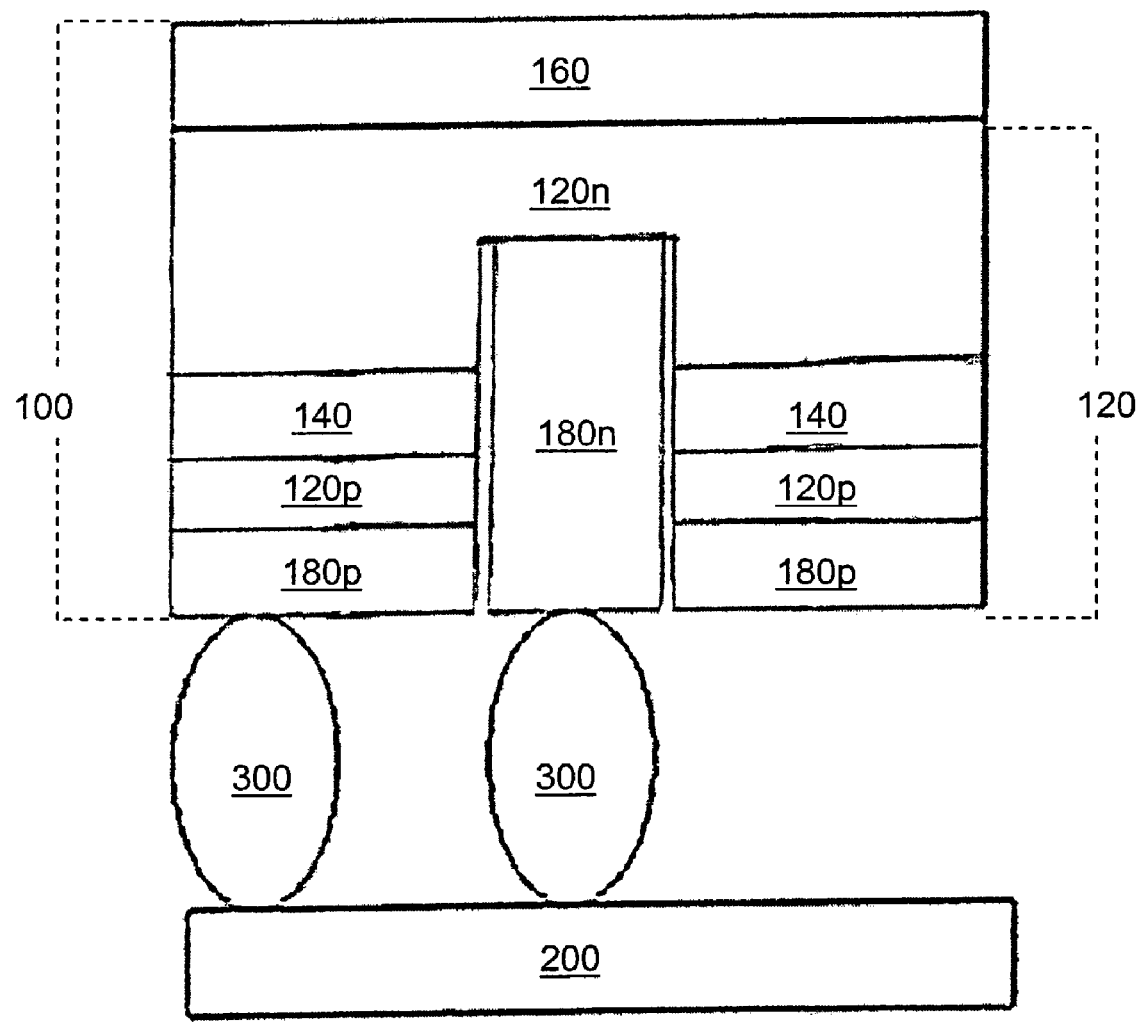
FIG. 5 depicting aspects of the present inventive subject matter, is a diagrammatic illustration showing a cross-sectional view of an exemplary LED die or chip that is flip-chip mounted to a support.

With reference to FIG. 5, there is shown an LED A, including an exemplary die or chip 100 mounted or being mounted to a support 200 (e.g., a mount, a sub-mount, a printed circuit board (PCB), a reflector cup, etc.) via a plurality of bonding bumps 300. While the LED A is illustrated for exemplary purposes herein, it is to be appreciated that device may be another suitable and/or similar light emitting device, or other suitable and/or similar semiconductor device.

For the illustrated LED A, the die 100 has an epitaxial structure 120 including multiple layers of semiconductor material and forming an active light-generating region 14 (e.g., a double heterostructure, multiple quantum well (MQW), or other suitable light-generating configuration). The structure 120 is disposed on a substrate 160. Suitably, the substrate 160 is substantially transparent or transmissive to light, e.g., at one or more wavelengths generated by the LED A. While only the illustrated epitaxial layers have been shown for purposes of the present example, it is to be appreciated that one or more additional and/or alternate structures or layers appropriate to a particular device may also be included, e.g., forming cladding layers, diffusion layers, refractive index matching layers, buffer layers, reflective layers, etc.

Suitably, the LED A is a group III-V based semiconductor device, e.g., an GaN and/or InGaN based device. However, the LED A is optionally based on an alternate system or configuration. The LED A suitably emits a spectrum of light in the ultraviolet and/or blue wavelength ranges, but may emit light having one or more wavelengths suitably ranging from infrared to ultraviolet. Suitably, the substrate 160 is sapphire, but may be any other appropriate material for the particular device, e.g., SiC, GaN, etc.

A pair of electrodes and/or electrical contacts (e.g., n-type contact 180n and p-type contact 180p) are also arranged on the LED in operative electrical communication with the light-generating region 140, e.g., via n-type and p-type layers of the epitaxial structure 120, i.e., layers 120n and 120p respectively. Accordingly, electrical power supplied to the LED A through the electrodes 180n and 180p drives the same to generate light. As illustrated, the LED A is a lateral current flip-chip LED device, with the electrodes 180n and 180p commonly located on the same side of the epitaxial structure 120, generally opposite the substrate 160.

In operation, an electric current passed through the LED A, using the electrical contacts 180n and 180p, is carried principally by electrons in the n-type layer 120n and by electron vacancies or "holes" in a p-type layer 120p. The electrons and holes move in opposite directions toward the active region 140 or a junction, where they recombine with one another. Energy released by the electron-hole recombination is emitted from the LED as light. As used herein, the term "light" includes visible light as well as electromagnetic radiation in the infrared and ultraviolet wavelength ranges. The wavelength of the emitted light depends upon many factors, including the composition of the semiconductor materials, the structure of the junction, the presence or absence of impurities or doping, and the like.

Figure 6:
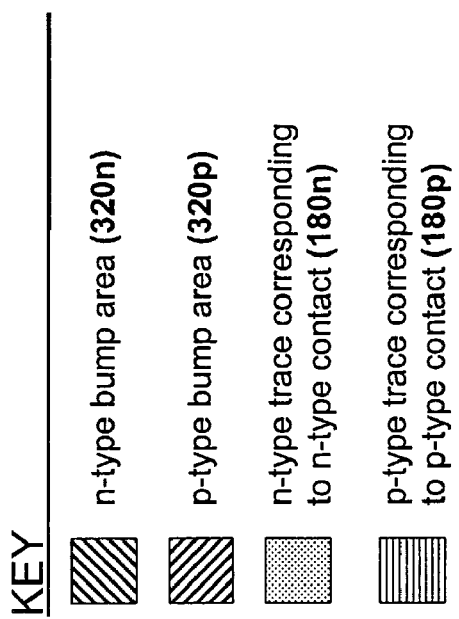
FIG. 6 is a diagrammatic illustration showing a top plan view of an exemplary LED die or chip having a contact layout or contact traces embodying aspects of the present inventive subject matter.
Figure 6:
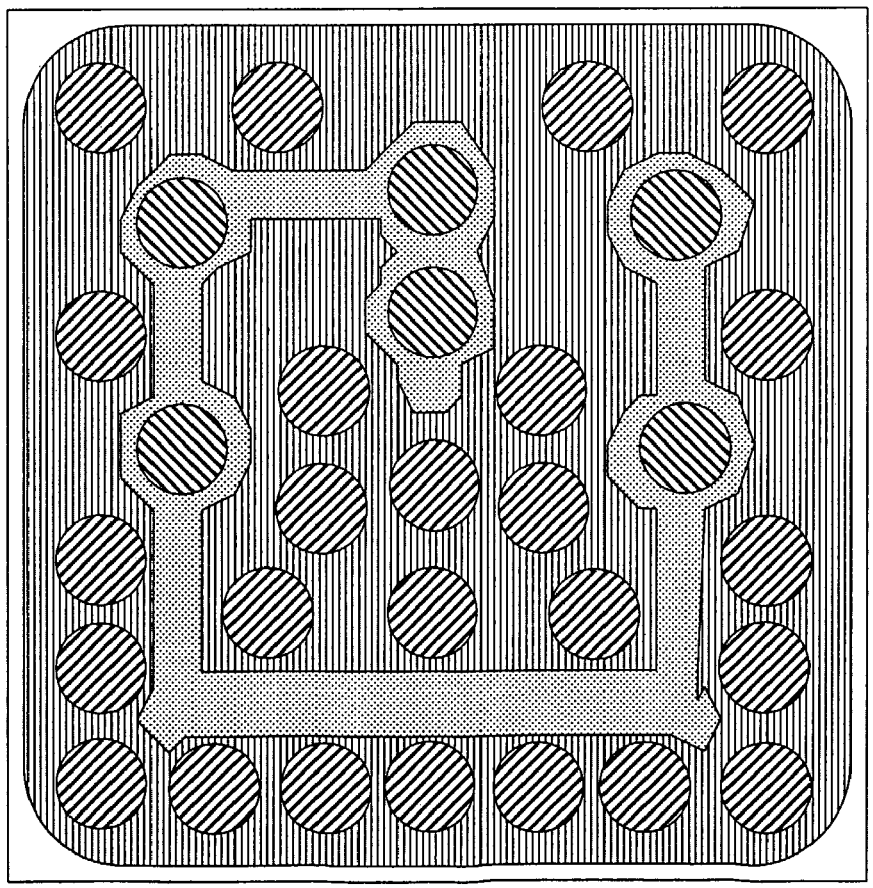
Figure 7:
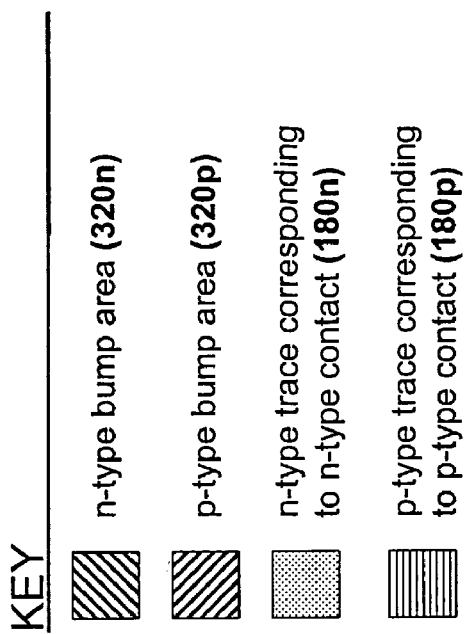
FIG. 7 is a diagrammatic illustration showing a top plan view of an exemplary LED die or chip having an alternate contact layout or contact traces embodying aspects of the present inventive subject matter.
Figure 7:
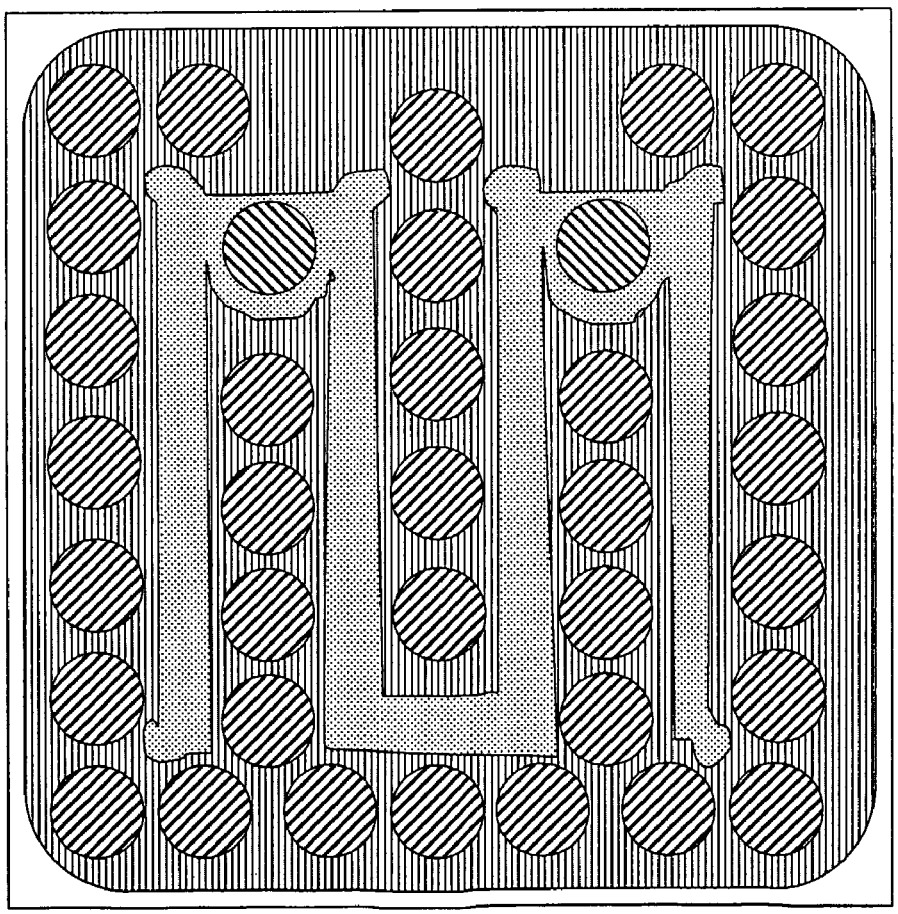

Suitably, the LED is mounted to the support 200 in flipped orientation, that is, with the light-generating region 140 proximate to the support 200 and the substrate 160 distal from the support 200. FIGS. 5, 6 and 7 show exemplary contact layouts or contact traces for flip-chip bonding. Bump areas are designated for each electrode or contact type. For example, n-type bump areas 320n are designated on the n-type contact 180n or n-type trace, and p-type bump areas 320p are designated on the p-type contact 180p or p-type trace. The respective bump areas correspond to the locations, within the respective p and n-type contact layouts or traces, where the bumps 300 contact and/or bond with the respective p and n-type electrodes or contacts 180p and 180n.

Suitably, the die 100 is mounted to the support 200 with a TS bonding process. One or more other suitable bonding processes, however, may alternately or additionally be employed, e.g., a thermocompression process, a soldering process, etc. The contacts 180n and 180p are suitably formed from one or more layers, e.g., that create a suitable electrically (and optionally thermally) conductive bond with the support 200. Optionally, at the support-facing end, the contacts 180n and 180p have a metallization or metallization layer that includes one or more layers of metal, metal alloys, or the like. Suitably, for TS bonding, the terminating surfaces where the bump areas 320n and 320p are designated, include an Au surface or layer. Similarly, the bumps 300 are also formed from one or more layers, e.g., that create a suitable electrically (and optionally thermally) conductive bond between the contacts 180n and 180p and the support 200. For TS bonding, the bumps 300 are suitably formed from Au or include an outer coating or layer of Au. Alternately, for a soldering process, the bumps 300 are formed from solder.

Suitably, the epitaxial structure 120 and contacts 180n and 180p are successively produced in layers upon the substrate 160, one over the other, to form the die 100, e.g., via epitaxial deposition or other suitable layering/coating or growth processes. For example, these may include metal-organic chemical vapor deposition (MOCVD; also known in the art as organometallic vapor phase epitaxy, OMVPE, and similar nomenclatures), molecular beam epitaxy (MBE), liquid phase epitaxy (LPE), or another suitable epitaxial growth technique or metallization process. As with the choice of substrate material, the choice of growth or layering technique is made based on the type of layer being produced.

In a suitable embodiment, after mesa formation, the p-type metal is deposited on the p-type contact layer (suitably, a GaN layer). The n-type contact is then defined and the device is protected, e.g., with a dielectric, along with definition of the p and n-type bump areas. The device is annealed at 250° C. After separation, the individual die 100 is ready for flip-chip bonding and subsequently thermosonically bonded to the support 100, with Au-terminated bumps 300.

In a suitable embodiment, the bumps 300 are formed and/or arranged on the support 200 so as to enable the chip or die 100 to be attached or bonded to the support 200 via the corresponding p and n-type bump areas 320p and 320n. The bonding of the die 100 to the support 200 is suitably achieved via a TS bonding process, e.g., with the application of ultrasonic energy, and suitably without any intermediate melting/re-solidification step. Consequently, lower packaging temperatures (e.g., around approximately 150° C.) can be used, thus avoiding loss of reflectivity of the p-type contact 180p. In addition, the use of Au bumps 300 instead of solder, lowers the thermal resistance of the package.

Deformation of the bumps 300, and physical bonding of the bumps 300 to the respective p and n-type bump areas 320p and 320n designated on the chip 100, occurs in the TS bonding process. Suitably, therefore, if TS bonding is being employed, the die 100 is formed so that the p and n-type bump areas 320p and 320n on the chip 100 are at substantially similar elevations, i.e., within the extent of deformation of the bumps 300. As best seen in FIG. 5, the LED die 100 for use in the TS bonding application has a thickened or elevated n-type contact 180n.

Figure 1:
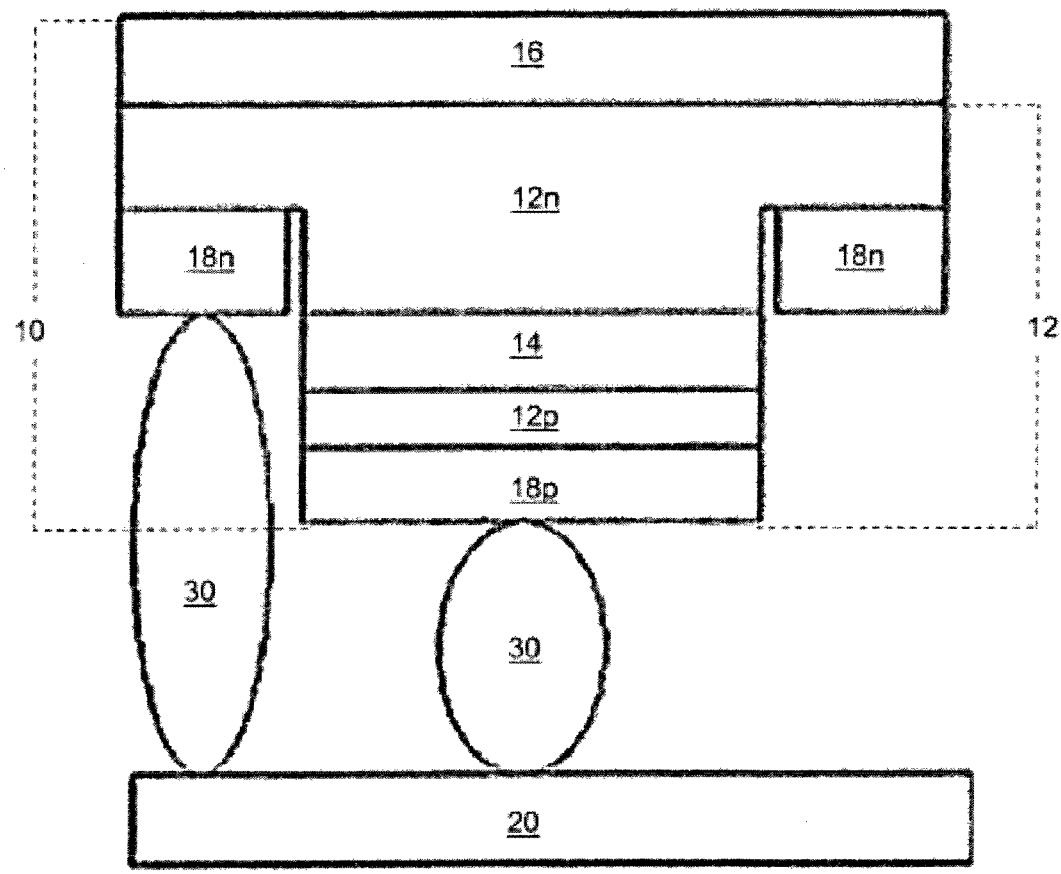
FIG. 1 is a diagrammatic illustration showing a cross-sectional view of a typical LED die or chip that is flip-chip mounted to a support in accordance with a conventional soldering process.
Figure 2:
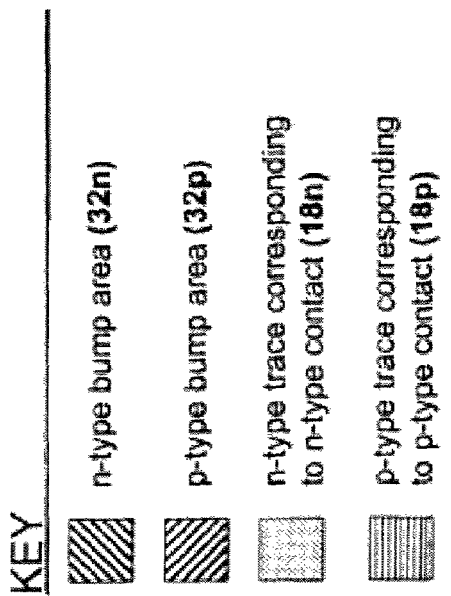
FIG. 2 is a diagrammatic illustration showing a top plan view of an exemplary LED die or chip having a contact layout or contact traces traditionally used in connection with a flip-chip mounting configuration.
Figure 2:
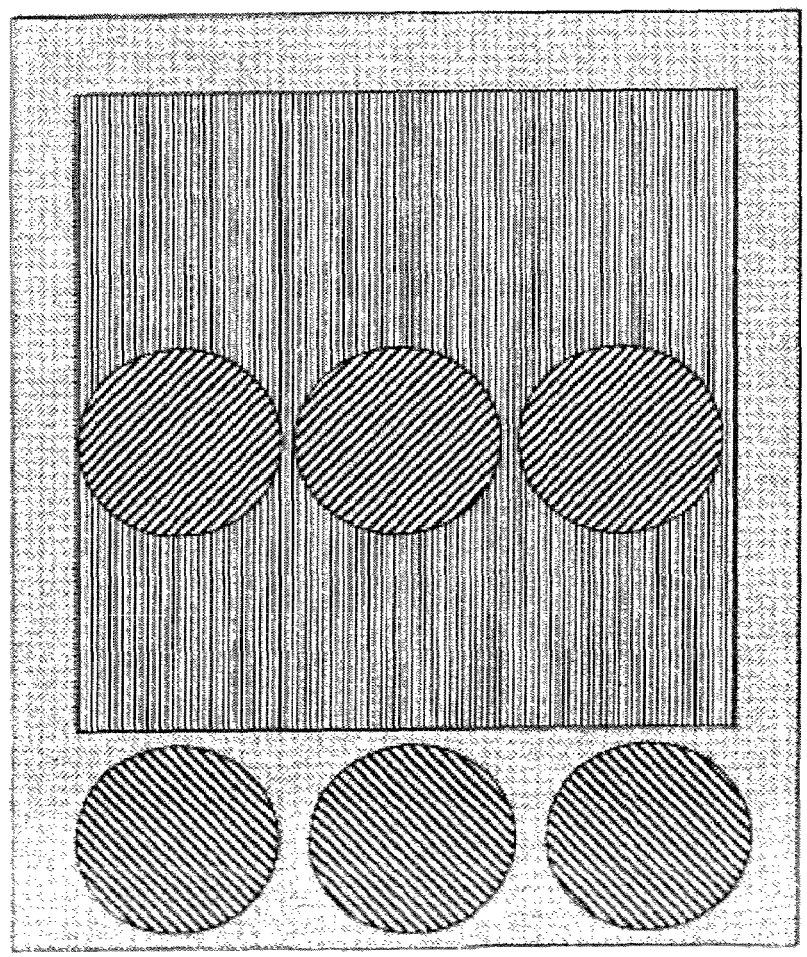
Figure 3:
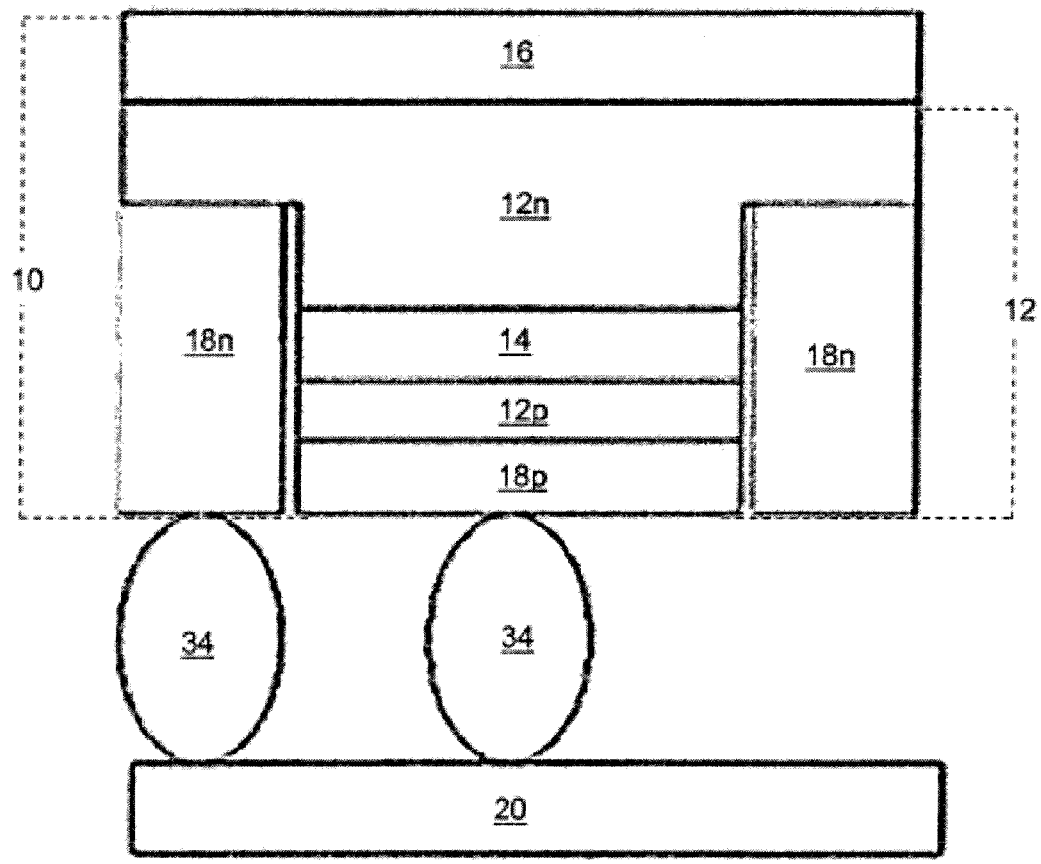
FIG. 3 is a diagrammatic illustration showing a cross-sectional view of a typical LED die or chip that is flip-chip mounted to a support in accordance with a conventional TS bonding process.
Figure 4:
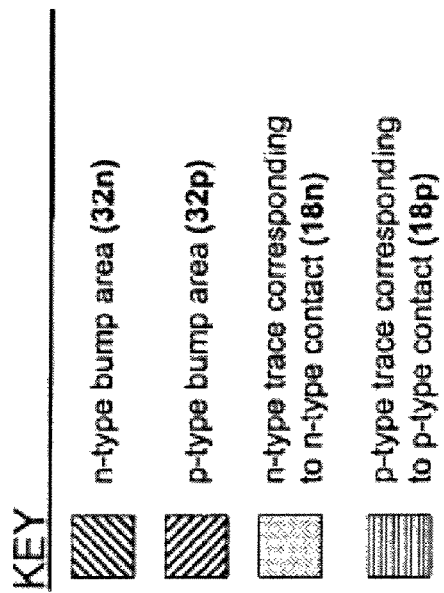
FIG. 4 is a diagrammatic illustration showing a top plan view of an exemplary LED die or chip having an alternate contact layout or contact traces for use in connection with a flip-chip mounting configuration.
Figure 4:
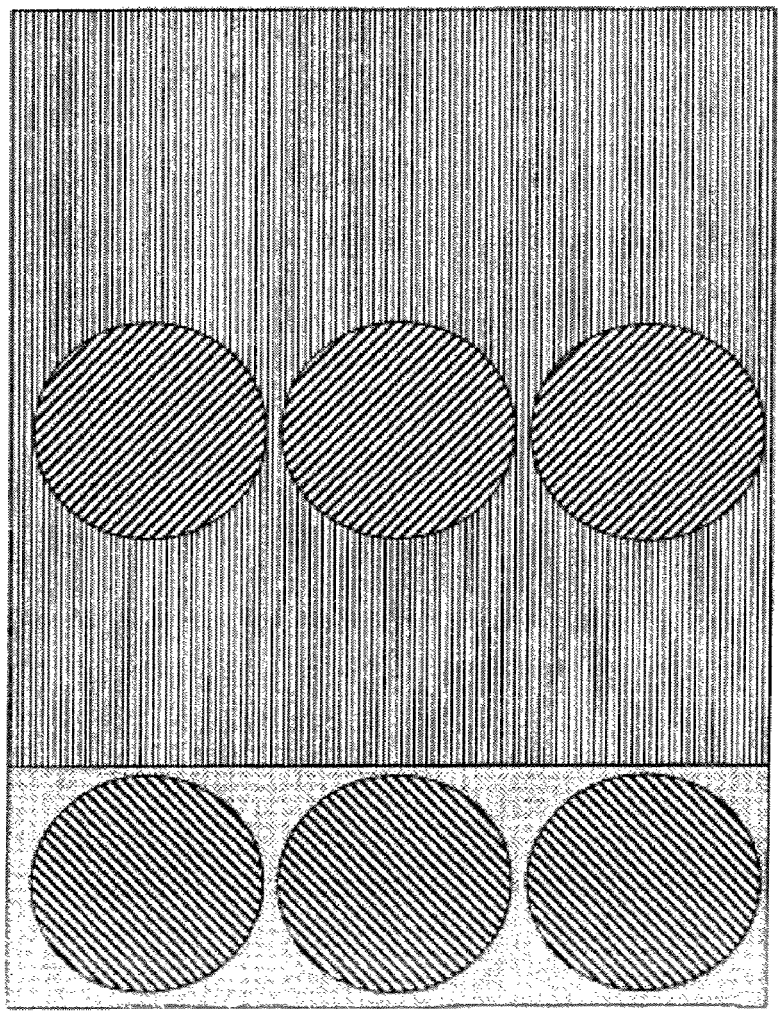
Figure 8:
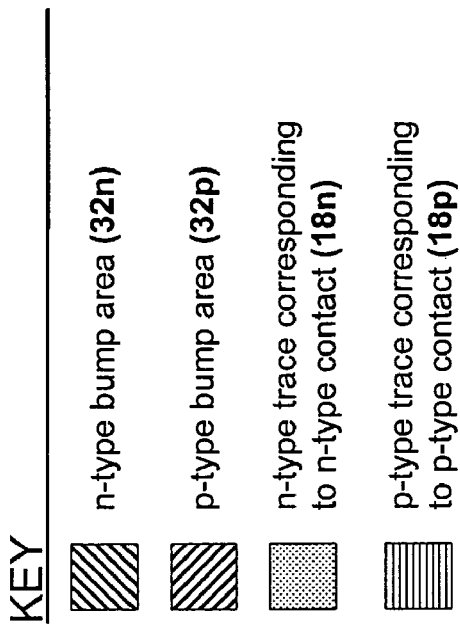
FIG. 8 is a diagrammatic illustration showing a top plan view of an exemplary LED die or chip having yet another alternate contact layout or contact traces embodying aspects of the present inventive subject matter.
Figure 8:
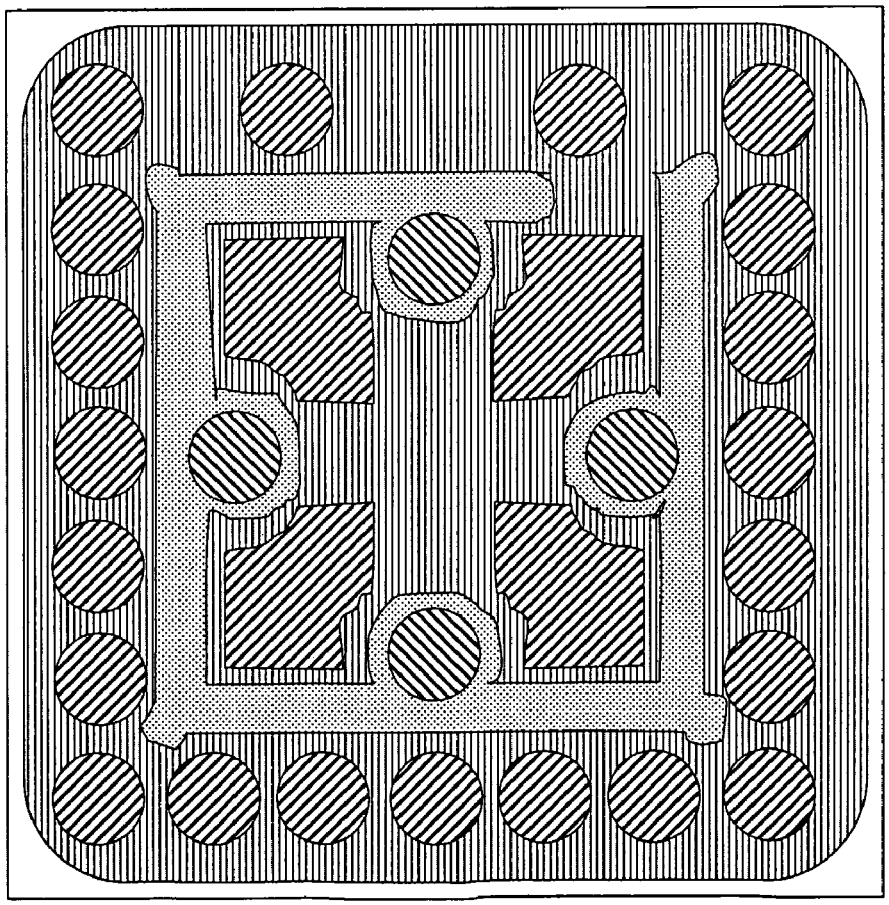

In accordance with aspects of the present inventive subject matter, a number of general features and several exemplary contact layouts or traces embodying the same are proposed which provide: optimized current spreading with minimal loss of light extraction efficiency; and, advantageous mounting performance or characteristics for TS bonding of dies or chips to their supports, e.g., in the flip-chip configuration. As seen in FIGS. 5, 6, 7 and 8, one feature entails elimination of the n-type trace on the outside or outer periphery of the chip, while still maintaining adequate current spreading with an n-type trace network in the interior of the chip. This design feature also results in the n-type bump areas being surrounded by p-type bump areas, thus, reducing problems associated with variations of the p and n-type bump heights on the support; in effect, it is more mechanically robust, e.g., in comparison to some of the designs discussed in the above-background. Suitably, as best seen in FIGS. 6, 7 and 8, the n-type trace defines an open ended path, as opposed to a closed path or loop, such as the one shown in FIG. 2. Referring again the examples shown in FIGS. 6, 7 and 8, the n-type trace optionally follows an elongated sinuous path through the chip's interior, thereby providing a suitably extensive neighboring boundary with the proximate p-type trace that is well distributed throughout the chip. This advantageously promotes uniform current spreading. In contrast, the n-type trace of FIG. 4 has a significantly less extensive neighboring boundary with the proximate p-type trace, and is more localized with respect to the entire chip.

Optionally, the current spreading is further enhanced, by having an n-type GaN layer with low resistivity (e.g., less than approximately 20 ohms/square). Additional advantage is achieved by connecting all the n-type trace portions together in a continuous network, thereby avoiding problems associated with an imperfect connection to, or bonding of, any one portion of the n-type trace. Robustness is further enhanced by yet another feature, namely, the p and n-type bump areas being at approximately the same level or elevation (see, e.g., FIG. 5). Assuming the difference between these surface levels or elevations is within the deformation range of the bumps, a reliable connection across the chip is achieved reproducibly.

Notably, dies with designs shown in FIGS. 6, 7 and 8 have been attached to sub-mounts with Au-terminated bumps and shown to have excellent mechanical robustness, e.g., when compared to some of the designs discussed in the above-background. In addition, substantially the entire p-type mesa lights up under forward bias, indicating uniform light emission, good current spreading and good contact at both the p and n-type regions of the chip with the sub-mount. These designs have also been demonstrated to result in a low thermal resistance at the chip/sub-mount interface.

In connection with the particular exemplary embodiments presented herein, certain structural and/or function features are described as being incorporated in particular embodiments. It is to be appreciated that different aspects of the exemplary embodiments may be selectively employed as appropriate to achieve other alternate embodiments suited for desired applications, the other alternate embodiments thereby realizing the respective advantages of the aspects incorporated therein.

Additionally, it is to be appreciated that certain elements described herein as incorporated together may under suitable circumstances be stand-alone elements or otherwise divided. Similarly, a plurality of particular functions described as being carried out by one particular element may be carried out by a plurality of distinct elements acting independently to carry out individual functions, or certain individual functions may be split-up and carried out by a plurality of distinct elements acting in concert. Alternately, some elements or components otherwise described and/or shown herein as distinct from one another may be physically or functionally combined where appropriate.

In short, the present specification has been set forth with reference to exemplary embodiments. Obviously, modifications and alterations will occur to others upon reading and understanding the present specification. It is intended that the inventive subject matter be construed as including all such modifications and alterations insofar as they come within the scope of the appended claims or the equivalents thereof.

What is claimed is:

1. A light emitting device including a semiconductor die, the semiconductor die comprising:
    an epitaxial structure arranged on a substrate, the epitaxial structure forming an active light generating region between a first layer on a first side of the active region and having a first conductivity type and a resistivity of less than twenty ohms per square, and a second layer on a second side of the active region and having a second conductivity type, the second side of the active region being opposite the first side of the active region and the second conductivity type being different that the first conductivity type;
    a first contact in operative electrical communication with the active region via the first layer in the epitaxial structure, the first contact being arranged on a side of the epitaxial structure opposite the substrate;
    a second contact in operative electrical communication with the active region via the second layer in the epitaxial structure, the second contact being arranged on a side of the epitaxial structure opposite the substrate;
    a first contact trace corresponding to the first contact and defined at a surface thereof distal from the substrate, the first trace including at least one area designated for bonding; and,
    a second contact trace corresponding the second contact and defined at a surface thereof distal from the substrate, the second trace including at least one area designated for bonding;
    wherein the first contact trace is substantially enclosed within the second contact trace.

2. The light emitting device of claim 1, wherein the first layer of the epitaxial structure is formed between the active region and the substrate.

3. The light emitting device of claim 1, wherein:
    the first conductivity type is n-type; and,
    the second conductivity type is p-type.

4. The light emitting device of claim 1, wherein the first trace forms an open ended elongated sinuous path.

5. The light emitting device of claim 1, wherein the light emitting device further comprises:
    a support to which the semiconductor die is mounted; and,
    a plurality of bumps arranged on the support, the bumps bonding the semiconductor die to the support via the first and second contacts at the areas designated for bonding in the first and second traces.

6. The light emitting device of claim 5, wherein the bumps bond the semiconductor die to the support via a thermosonic bonding process including the application of ultrasonic energy.

7. The light emitting device of claim 1, wherein the surface of the first contact distal from the substrate and the surface of the second contact distal from the substrate are substantially coplanar with one another.

8. A light emitting device including a semiconductor die, the semiconductor die comprising:
    an epitaxial structure arranged on a substrate, the epitaxial structure forming an active light generating region between a first layer on a first side of the active region and having a first conductivity type, and a second layer on a second side of the active region and having a second conductivity type, the second side of the active region being opposite the first side of the active region and the second conductivity type being different that the first conductivity type;
    a first contact in operative electrical communication with the active region via the first layer in the epitaxial structure, the first contact being arranged on a side of the epitaxial structure opposite the substrate;
    a second contact in operative electrical communication with the active region via the second layer in the epitaxial structure, the second contact being arranged on a side of the epitaxial structure opposite the substrate;
    a first contact trace corresponding to the first contact and defined at a surface thereof distal from the substrate; and,
    a second contact trace corresponding the second contact and defined at a surface thereof distal from the substrate;
    wherein the first contact trace is substantially enclosed within the second contact trace; and
    wherein the first contract trace includes at least one area designated for bonding having a first surface level and the second contact trace includes at least one area designated for bonding having a second surface level, the first surface level and the second surface level being within a deformation range of a bonding gold layer.

9. The light emitting device of claim 8, wherein the first layer of the epitaxial structure is formed between the active region and the substrate.

10. The light emitting device of claim 8, wherein the first conductivity type is n-type and the second conductivity type is p-type.

11. The light emitting device of claim 8, wherein the first contact trace forms an open ended elongated sinuous path.

12. The light emitting device of claim 8, wherein the light emitting device further comprises:
    a support to which the semiconductor die is mounted; and,
    a plurality of bumps bonding the semiconductor die to the support via the first and second contacts at the areas designated for bonding in the first and second contact traces.

13. The light emitting device of claim 12, wherein the bumps bond the semiconductor die to the support via a thermosonic bonding process including the application of ultrasonic energy.

* * * * *